(12) United States Patent
Xu et al.

(10) Patent No.: US 10,743,434 B1
(45) Date of Patent: Aug. 11, 2020

(54) SERVER

(71) Applicants:Inventec (Pudong) Technology Corporation, Shanghai (CN); INVENTEC CORPORATION, Taipei (TW)

(72) Inventors: Ji-Peng Xu, Shanghai (CN); Ying Qian, Shanghai (CN); Xiaogang Lu, Shanghai (CN); Fang-Jie Chu, Shanghai (CN); Li-Hong Huang, Shanghai (CN); Peng Zhan, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/507,315

(22) Filed: Jul. 10, 2019

(30) Foreign Application Priority Data

Mar. 14, 2019 (CN) .......................... 2019 1 0194615

(51) Int. Cl.
*H05K 7/14* (2006.01)
*H05K 5/02* (2006.01)
*H05K 7/20* (2006.01)
*H05K 7/18* (2006.01)

(52) U.S. Cl.
CPC ........... *H05K 7/1438* (2013.01); *H05K 5/023* (2013.01); *H05K 5/0213* (2013.01); *H05K 7/1487* (2013.01); *H05K 7/1489* (2013.01); *H05K 7/183* (2013.01); *H05K 7/20172* (2013.01)

(58) Field of Classification Search
CPC .. H05K 7/1438; H05K 5/023; H05K 7/20172; H05K 7/1489; H05K 5/0213; H05K 7/1487; H05K 7/183
See application file for complete search history.

(56) References Cited

U.S. PATENT DOCUMENTS

| | | | | |
|---|---|---|---|---|
| 9,025,326 B1 * | 5/2015 | Xu | ........................ | H05K 7/1487 |
| | | | | 361/679.37 |
| 9,844,163 B2 * | 12/2017 | Zhu | ...................... | H05K 7/1487 |
| 9,918,399 B1 * | 3/2018 | Deng | ................... | H05K 7/1487 |
| 10,091,905 B1 * | 10/2018 | Konovalov | .......... | G11B 33/144 |
| 10,314,195 B1 * | 6/2019 | Xu | ........................ | H05K 7/1489 |

(Continued)

*Primary Examiner* — Abhishek M Rathod
(74) *Attorney, Agent, or Firm* — Locke Lord LLP; Tim Tingkang Xia, Esq.

(57) ABSTRACT

The invention provides server including a casing. The casing has back panel area. The back panel area is located at air outlet of the server. Package substrate, up HDD back panel and down HDD back panel are horizontally disposed on the back panel area. Motherboard of the server is communicatively connected to the package substrate via first connector. The package substrate is communicatively connected to the up HDD back panel via second connector. The up HDD back panel is communicatively connected to the down HDD back panel via third connector. The server of the invention has high dense storage devices, very high space utilization, and innovative heat dissipation channels design. The server has high configuration flexibility and expansibility, can be operated in a simple manner, and can support apparatus that are power-consuming and operating in standby mode.

10 Claims, 12 Drawing Sheets

(56) References Cited

U.S. PATENT DOCUMENTS

| | | | | |
|---|---|---|---|---|
| 2008/0148303 A1* | 6/2008 | Okamoto | G11B 33/128 | 720/652 |
| 2008/0201512 A1* | 8/2008 | Lee | G06F 13/423 | 710/300 |
| 2010/0265645 A1* | 10/2010 | Wang | G06F 1/181 | 361/679.4 |
| 2010/0265650 A1* | 10/2010 | Chen | H05K 7/1492 | 361/679.33 |
| 2014/0108692 A1* | 4/2014 | Doglio | G06F 1/183 | 710/300 |
| 2016/0041590 A1* | 2/2016 | Yu | G06F 1/185 | 361/679.32 |
| 2016/0150667 A1* | 5/2016 | Xu | H05K 7/1487 | 361/679.4 |
| 2016/0157378 A1* | 6/2016 | Xu | H05K 7/1487 | 361/679.31 |
| 2017/0150621 A1* | 5/2017 | Breakstone | G11B 33/142 | |
| 2017/0202111 A1* | 7/2017 | Huang | H05K 7/20736 | |
| 2018/0352679 A1* | 12/2018 | Monson | G11B 33/128 | |
| 2018/0359878 A1* | 12/2018 | Xu | H05K 7/20136 | |
| 2019/0104632 A1* | 4/2019 | Nelson | G06F 1/183 | |

\* cited by examiner

SERVER

CROSS-REFERENCE TO RELATED APPLICATIONS

This non-provisional application claims priority under 35 U.S.C. § 119(a) on Patent Application No(s). 201910194615.5 filed in China, on Mar. 14, 2019, the entire contents of which are hereby incorporated by reference.

BACKGROUND OF THE INVENTION

Technical Field of the Invention

The invention relates to the field of hardware, more particularly to a server.

Description of the Related Art

With the development of servers, demands in servers become higher than ever, such as higher security, more flexible arrangement, more powerful storage capability, better expendability, and lower cost. The conventional configuration is not able to meet the requirements of clients, and which urges developers to constantly upgrade and optimize the design of server, increasing the compatibility, and reducing the cost.

SUMMARY OF THE INVENTION

To accomplish the above objective and other related objectives, the invention provides a server, the server includes a casing; the casing has a back panel area; the back panel area is located on an air outlet of the server; a package substrate, an upper HDD back panel and a lower HDD back panel are horizontally disposed on the back panel area; a motherboard of the server is communicatively connected to the package substrate via a first connector; the package substrate is communicatively connected to the upper HDD back panel via a second connector; the upper HDD back panel is communicatively connected to the lower HDD back panel via a third connector.

In one embodiment of the invention, the first connector includes a bridge board, and the motherboard of the server is communicatively connected to the package substrate via the bridge board.

In one embodiment of the invention, the second connector and the third connector are board-to-board connectors.

In one embodiment of the invention, the casing further has a front panel area for the installation of a hard disk drive; an upper and lower slidable trays and an upper and lower inner slide rails are disposed on the front panel area of the casing; the upper and lower slidable trays are respectively slidably disposed on the upper and lower inner slide rails.

In one embodiment of the invention, an upper and lower cable arms are disposed on the front panel area of the casing, the upper and lower cable arms are foldable; when the upper and lower slidable trays are drawn out of the casing through the upper and lower slide rails, the upper and lower cable arms respectively experience force and thus being unfolded, when the upper and lower slidable trays slide into the casing through the upper and lower slide rails, the upper and lower cable arms respectively experience force and thus being folded.

In one embodiment of the invention, a fan frame is disposed on the back panel area of the casing and is configured for the installation of a plurality of fan assemblies; an engagement structure is disposed on the fan frame and configured to conveniently install the fan frame in the casing.

In one embodiment of the invention, each of the fan assemblies has a handle configured for the manual installation of the plurality of fan assemblies into the fan frame, or for the manual removal of the plurality of fan assemblies from the fan frame.

In one embodiment of the invention, a fan control board and a PDB of the server are connected by a board-to-board manner and are configured to supply electricity to the server.

In one embodiment of the invention, the fan control board of the server is in a L-shape for matching different types of the motherboard.

In one embodiment of the invention, the motherboard is connected to a disk assembly via a host bus adapter configured outside and/or an I2C interface that is reserved.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
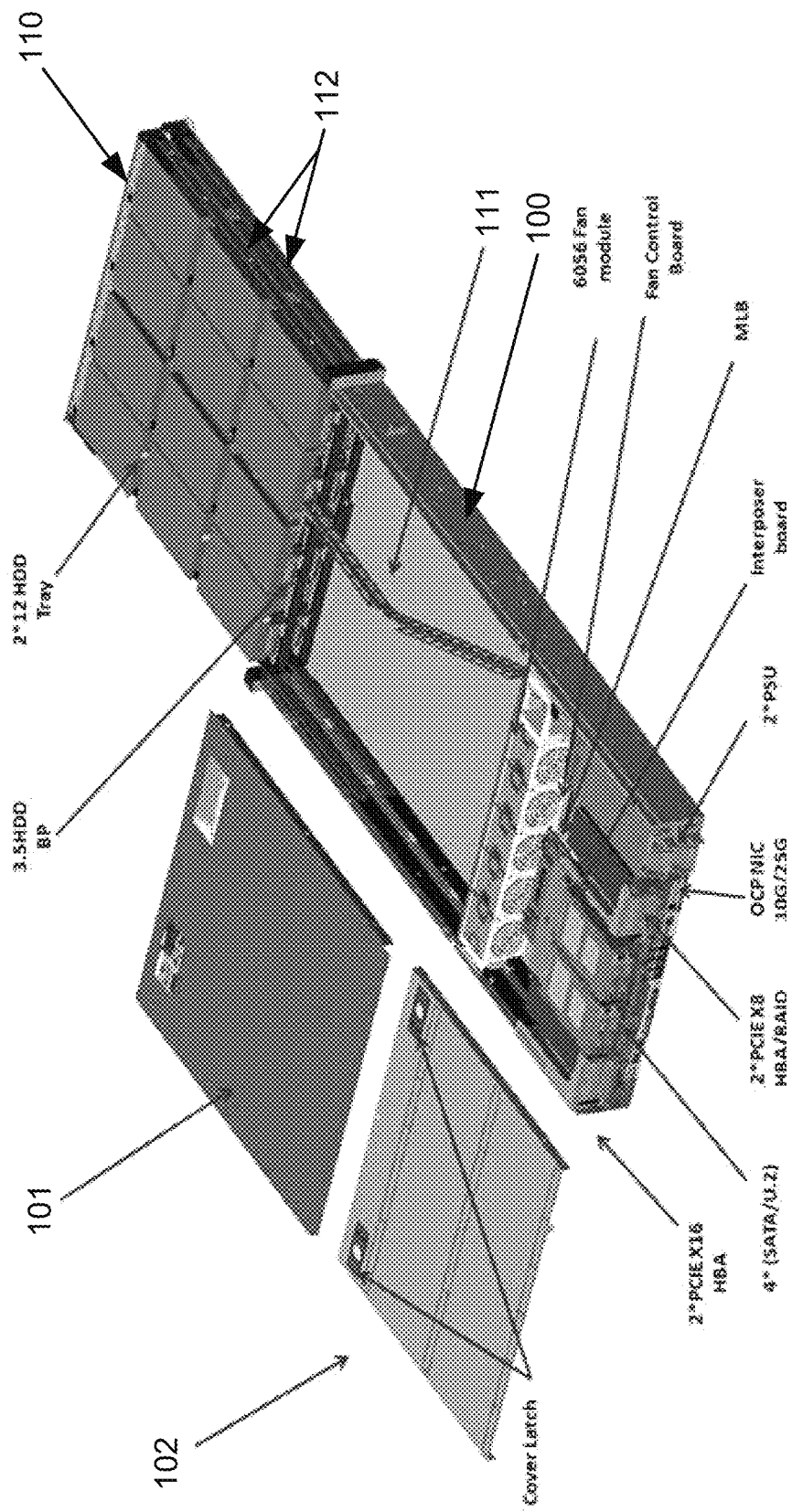
FIG. 1 is an exemplary implementation schematic diagram of a server according to one embodiment of the invention.

In the following detailed descriptions, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Specific examples are used to explain the embodiments of the invention hereinafter, and a person skilled in the art may understand other advantages and functions of the invention by the following descriptions. The invention may be implemented or applied in other manners. Various details in the descriptions may be modified or varied based on different aspects and applications without departing from the spirit of the invention. It is to be explained that, in case of no confliction, the following embodiments and the features thereof may be combined.

It is to be explained that, the drawings provided for the following embodiments are only schematically explain the configurations of the invention, so only the assemblies related to the invention are shown in the drawings and the drawings does not illustrate the actual number, shape and size of the components. In the embodiments of the invention, the configuration, number and ratio of the components may be altered in an arbitrary way and the arrangement of the components may be more complex.

"U" is an abbreviation of unit and denotes an external size of a server, and its detailed size is defined by the U.S. Energy Information Administration (EIA). The reason to define the size of servers is to ensure the servers are in a proper size and able to be placed on a rack made of iron or aluminum. The rack has screw holes for fixing the server so that they can correspond to the screw holes of the server, and screws are provided to fix the server in position so as to determine the space required by each server. The width and length of the rack respectively are the multiple of the width (48.26 centimeters (cm)=19 inches (in)) and height (4.445 cm) of the server. Therefore, the rack whose width is 19 inches sometimes may be called "19-in rack". The unit for measuring the thickness is 4.445 cm. "1U" is 4.445 cm, and "2U" being double the height of 1U is 8.89 cm.

Please refer to FIG. 1, the embodiment of the invention provides a server, the server includes a casing 100. The casing 100 has a front panel area 101 and a back panel area 102. The front panel area 101 is an area for Hard disk drive (HDD). The back panel area is an area for motherboard 122, power supply, fan, fan control board 121, processor, and various interface assemblies.

Figure 2:
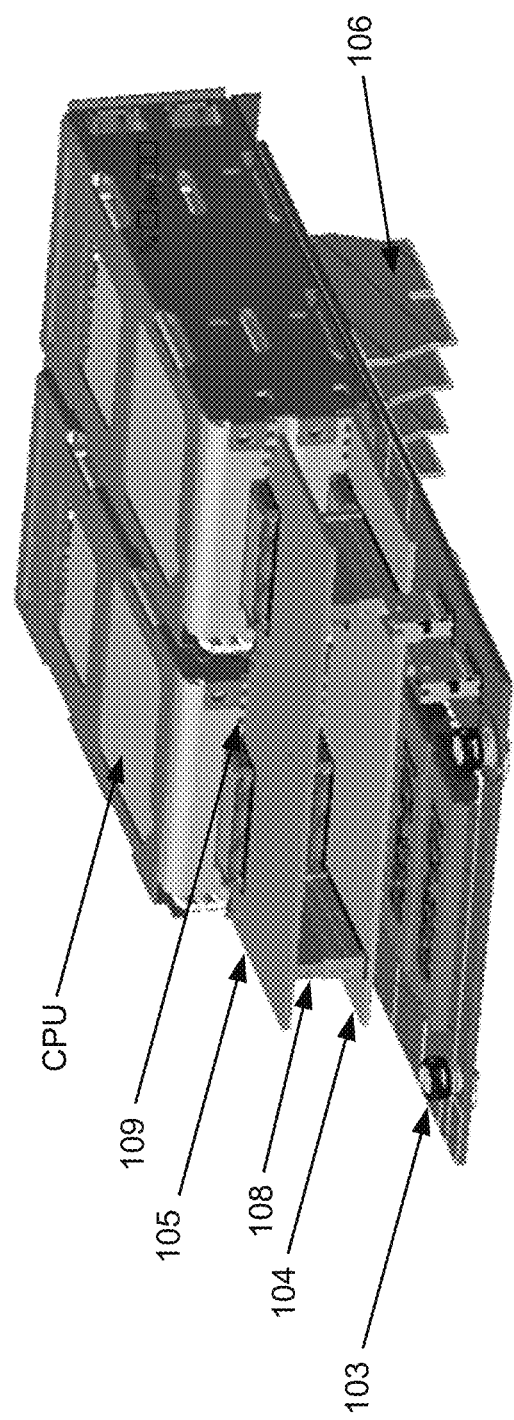
FIG. 2 is an exemplary implementation schematic diagram of a back panel area of the server according to one embodiment of the invention.

In one embodiment of the invention, as shown in FIG. 2, which shows a schematic diagram of a heat dissipation structure of one embodiment of the invention. The back panel area 102 is located on an air outlet of the server. A package substrate 103, a upper HDD back panel 104, and a lower HDD back panel 105 are horizontally disposed on the back panel area 102; the motherboard of the server is communicatively connected to the package substrate 103 via a first connector 106; the package substrate 103 is communicatively connected to the upper HDD back panel 104 via a second connector, and the upper HDD back panel 104 is communicatively connected to the lower HDD back panel 105 via a third connector 108. The function of the first connector 106 may be implemented by a fine and sophisticated connector and bridge board; the function of the second connector may be implemented by a BTB (Board to Board) connector; the function of the third connector 108 may also be implemented by a BTB connector.

Specifically, the package substrate 103 (interposer), the upper HDD back panel 104 (Up HDD BP) and the lower HDD back panel 105 (Down HDD BP) are stacked to form a three-layer structure, and these layers can be directly connected via BTB connectors. The high-speed signal such as PCIE on the motherboard 122 is transferred to a fine and sophisticated connector, then is transferred to the package substrate 103 (interposer) via the bridge board, then is transferred to the upper HDD back panel 104 (Up HDD BP) via the BTB connector, and then is transferred to the lower HDD back panel (Down HDD BP) 105 via the BTB connector, thereby implementing the signal transfer among the three horizontally stacked layers. In such design of configuration and hardware, heat dissipation channels for U.2 are obtained to perfectly solve the problem of heat dissipation The air blown from the fan can flow directly toward the heat dissipation plate 109 of the processor through the heat dissipation channels of U.2 without being blocked, thereby achieving a high heat dissipation efficiency. U.2 interface is also called SFF-8639 and it is defined by the SSD Form Factor Work Group. U.2 not only supports the SATA-Express but also is compatible to other standards such as SAS or SATA. Therefore, it can be regarded as a four-channel version of SATA-Express interface and its theoretical bandwidth has reached 32 Gbps, having no difference with M.2 interface. M.2 is originally called NGFF interface, and it is a new interface standard designed for Ultrabook and is mainly used to replace the mSATA interface, having features such as small volume and mainstream efficiency.

Figure 3:
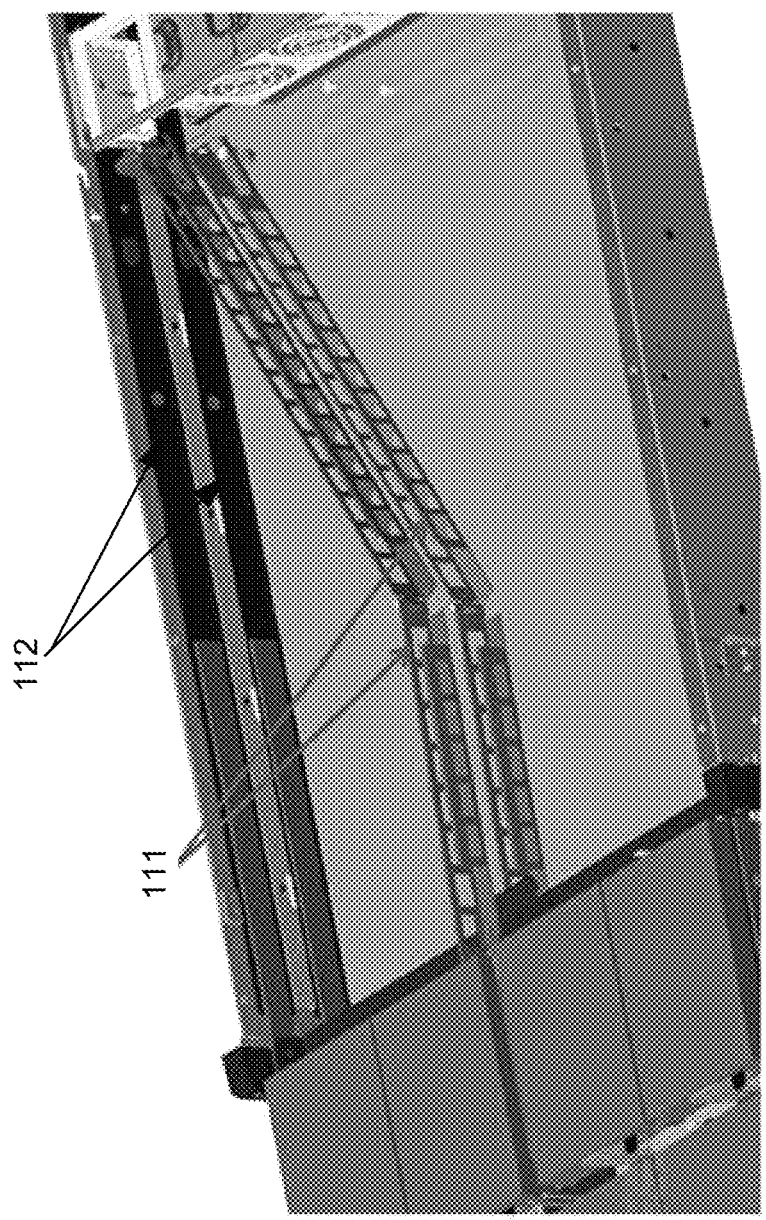
FIG. 3 is an exemplary implementation schematic diagram of a front panel area of the server according to one embodiment of the invention.

In one embodiment of the invention, please refer to FIG. 1 and FIG. 3, which show schematic diagrams of a slidable structure of one embodiment of the invention. In FIG. 1 and FIG. 3, there are an upper and lower slidable trays 110, an upper and lower cable arms 111, and an upper and lower slide rails 112 that are disposed on the front panel area 101 of the casing 100; the upper and lower slidable trays 110 are slidable by being respectively disposed on the upper and lower slide rails 112; the upper and lower cable arms 111 both are foldable structures. When the upper and lower slidable trays 110 are drawn out of the casing 100 through the upper and lower slide rails 112, the upper and lower cable arms 111 respectively experience force and thus being unfolded. When the upper and lower slidable trays 110 slide into the casing 100 through the upper and lower slide rails 112, the upper and lower cable arms 111 respectively experience force and thus being folded.

Specifically, there are twenty-four 3.5 HDDs of the entire server applied to the upper and lower slidable trays 110, supporting toolless assemble. The slide rails of the invention are able to bear heavy load, and the casing has a high structural strength design, ensuring the HDDs and other function modules can be installed in a toolless manner and enabling a smooth hot insertion and removal. The simple and economical design of the cable arms (i.e. the upper and lower cable arms 111) permits the cable arms to be drawn out by the maximum length of 530 mm so that the system appears organized and practical, largely shortening the SAS (Serial Attached SCSI) cables to be less than 1.45 m and thus ensuring the quality of signal.

Figure 4:
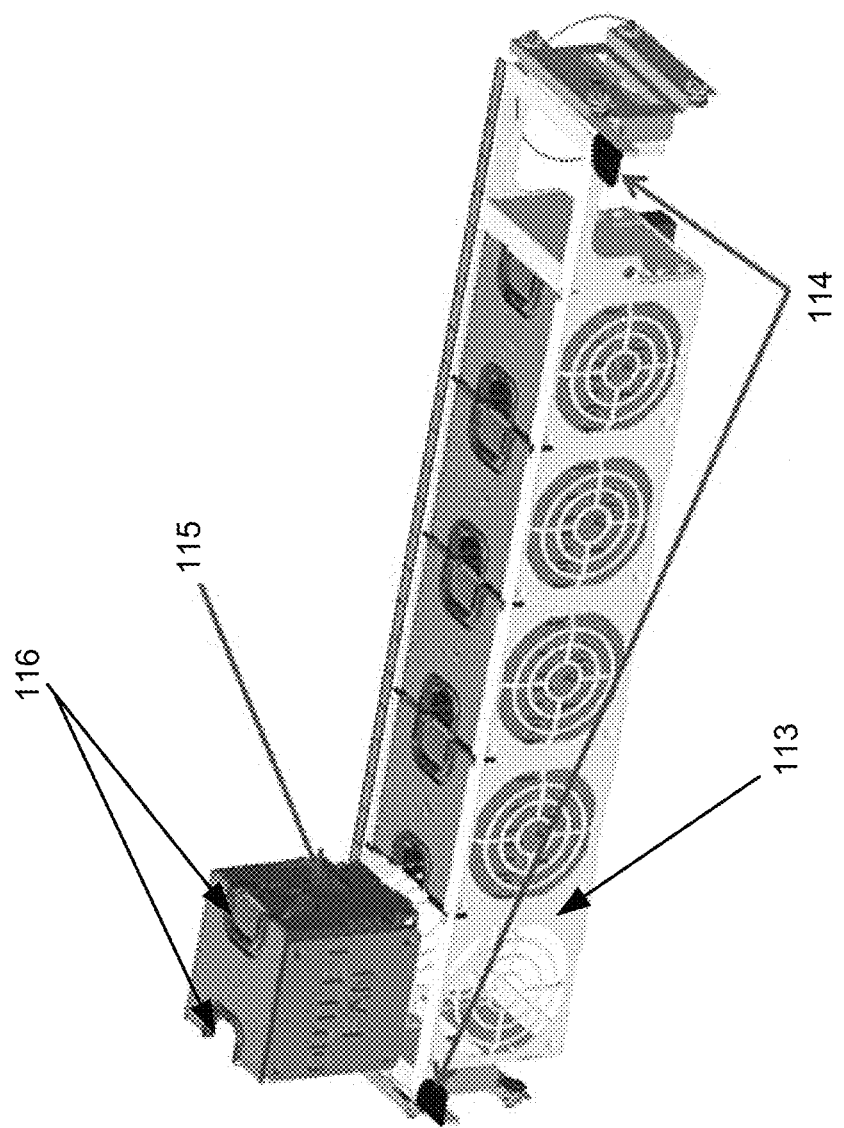
FIG. 4 is an exemplary implementation schematic diagram of a fan of the server according to one embodiment of the invention.

In one embodiment of the invention, please refer to FIG. 4, which shows a schematic diagram of a fan of one embodiment of the invention. There is a fan frame 113 disposed on the back panel area 102 of the casing 100 and configured for the installation of a plurality of fan assemblies 115; each fan assembly 115 has a handle 116 for user to manually install the fan assembly 115 into the fan frame 113 or manually detach the fan assembly 115 from the fan frame 113. The fan frame 113 has an engagement structure 114 configured for conveniently installing the fan frame 113 into the casing 100. The fan frame 113 is modularized and thus able to be detached in a toolless manner and permitting the hot insertion and removal of each fan assembly 115.

The server of the invention also allows the hot insertion and removal of a regular power supply unit (PSU) and a REAR HDD, such that the invention offers the toolless installation and hot insertion/removal of the regular replaceable components. The server of the invention can operate in a simple manner, the twenty-four 3.5 HDDs can be disposed in the upper and lower slidable trays 110 in a toolless manner; slide rails are inner slide rails, and the casing 100 has a high structural strength design, ensuring the HDDs and other function modules can be installed or detached on a cabinet in a toolless manner and enabling a smooth hot insertion and removal. The maximum number of five fans with two rotors as well as the redundant design are supported, and the entire frame of the fan assemblies 115 and each fan assembly 115 can be installed or detached without using additional tool.

Figure 5A:
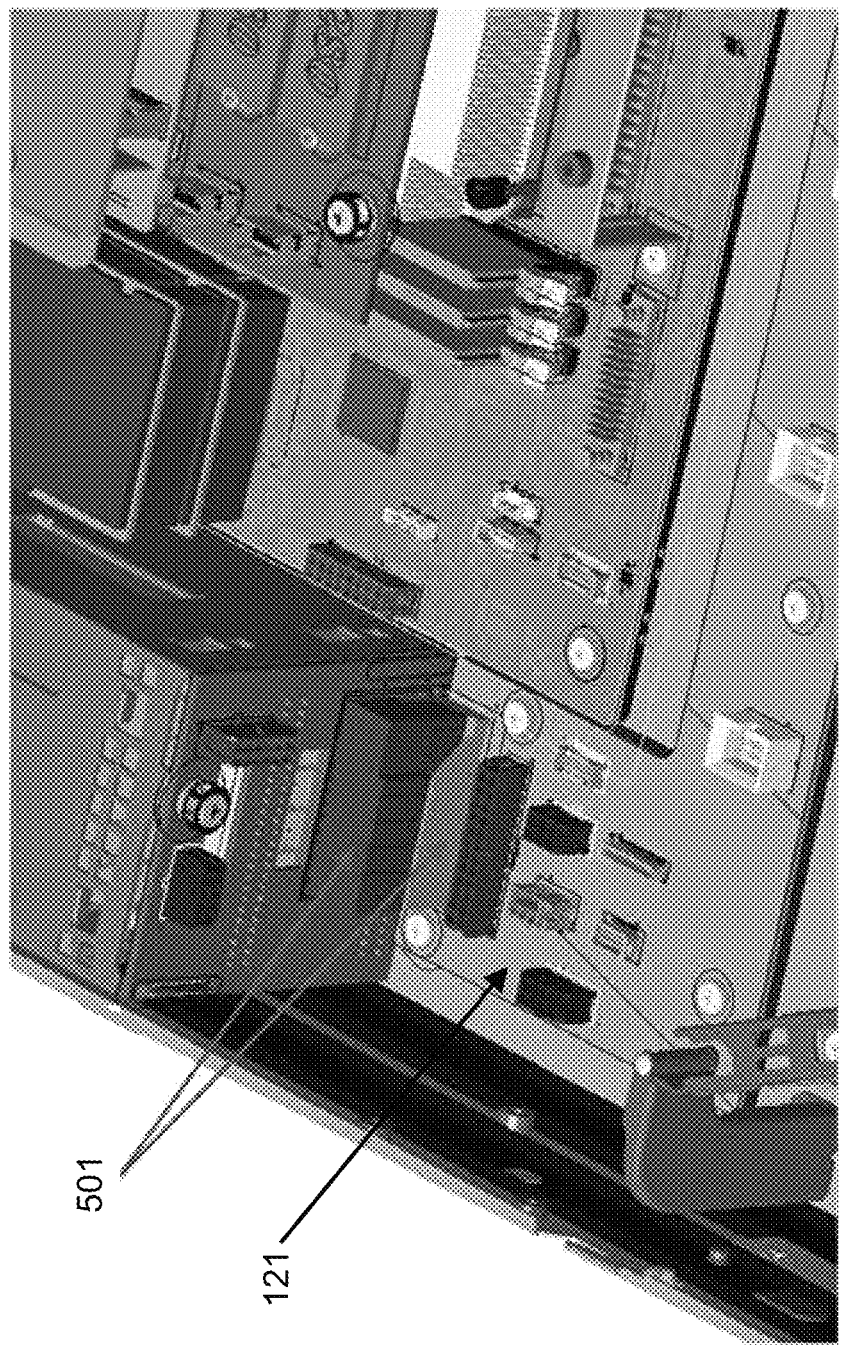
FIG. 5A is an exemplary implementation schematic diagram of a circuit board of the server according to one embodiment of the invention.

In one embodiment of the invention, please refer to FIG. 5A, which shows a schematic diagram of a circuit board of one embodiment of the invention. A fan control board (FCB) 121 of the server and a power daughter board (PDB) are connected via a board-to-board manner (referring to reference number 501) for supplying electricity to different types of the motherboard 122.

Figure 5B:
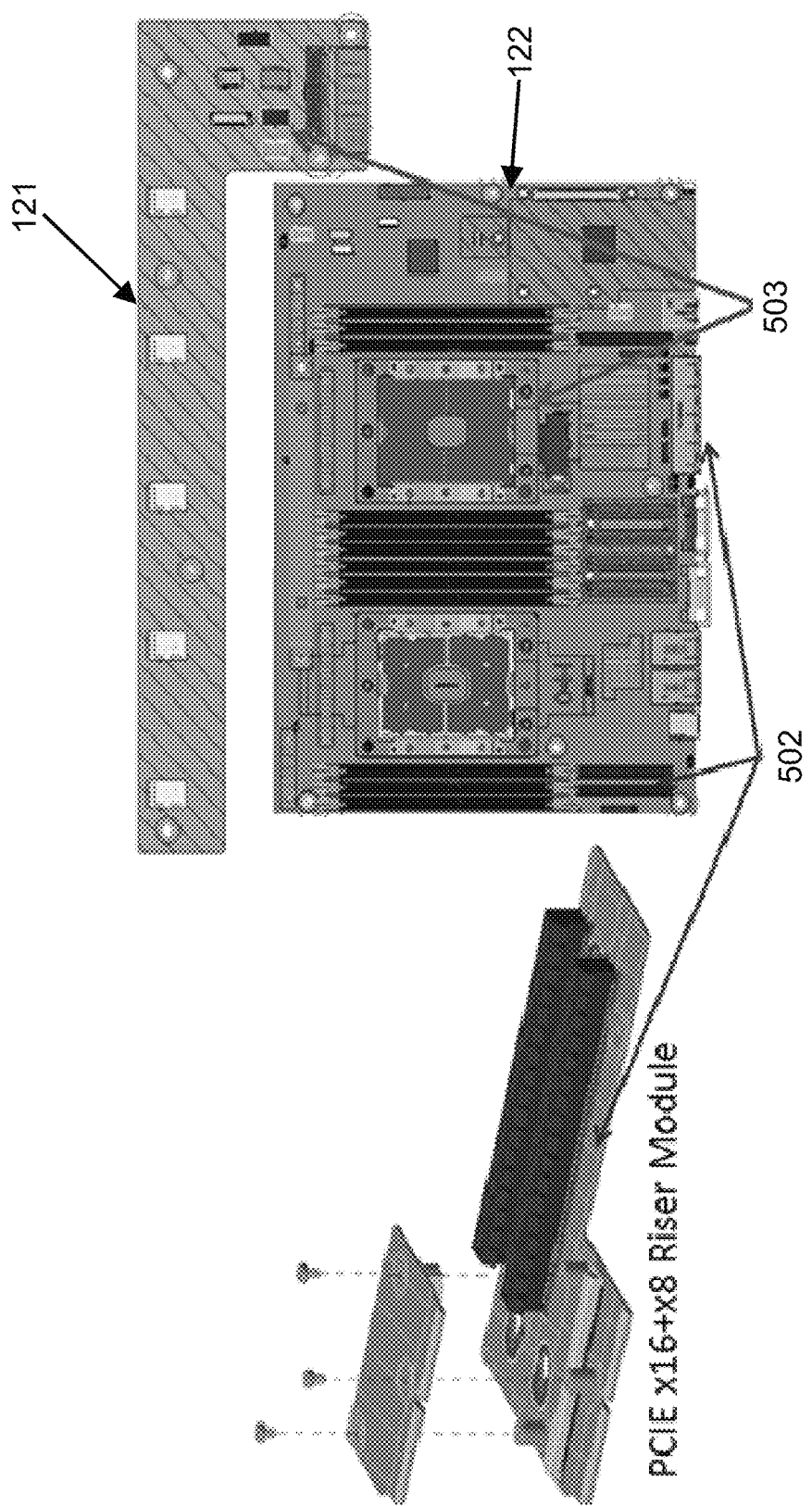
FIG. 5B is an exemplary implementation schematic diagram of a fan control board of the server according to one embodiment of the invention.

In one embodiment of the invention, please refer to FIG. 5B, the fan control board (FCB) 121 of the server is in L shape, for matching different types of the motherboard 122 (referring to reference number 503). The server of the invention may support XEON-D, Dual Socket E5, and other types of motherboards. The fan control board (FCB) 121 is connected to the PDB via a board-to-board manner. The FCB supply electricity to the motherboard 122 so as to allow the FCB/PDB to cooperate with the motherboard 122 of different configurations, thereby obtaining the most compatibility thereof and reducing the development cost and thus achieving high flexibility.

In one embodiment of the invention, please refer to FIG. 5B, the motherboard 122 is connected to the disk assembly via a host bus adapter (HBA) 502, which is exposed to outside, and/or a reserved I2C interface, thereby further expanding the storage function. Specifically, in the invention, the storage function can be further expanded by using two HBAs, which are exposed to outside, and connecting four reserved I2C interfaces, which are in the form of RJ45, to four disk assemblies (JBOD). Host bus adapter (HBA) is a circuit and/or integrate circuit adapter that offers input/output processes and physical connection between the server and the storage device. Since the HBA shares the burden for the main processor in data storage and searching task, it helps improving the performance of the server. One HBA and the sub-system of disk, that are connected to each other, may be referred to as a disk channel.

The server of the invention has high storage density, the space of 2U can accommodate twenty-four hot insertion/removal-type 3.5 HDDs and four U.2 interfaces (may selectively support PCIe SSD or sata HDD) and two M.2 interfaces (may selectively support PCIe M.2 or sata M.2). Serial Advanced Technology Attachment (SATA) is a serial hard disk drive interface based on industry standard and is a hard disk drive standard provided by Intel, IBM, Dell, APT, Maxtor and Seagate.

In the server of the invention, the system and the critical data storage device are flexible in configuration. Upon the high efficiency, stability and low cost, clients may use M.2 or U.2 as the system disk or critical data storage device according to the application. In the case of M.2, SATA M.2 or PCIe M.2 may be used according to the required activating speed; in the case of U.2, PCIe SSD or SATA HDD may be used according to the performance and the cost. When using SATA HDD, regarding the system operation security and the critical data security, Redundant Arrays of Independent Drives (RAID) card may be used to connect the SATA HDD or the HBA may be used to directly connect the SATA HDD.

The rear back panel area 102 is located on the air outlet of the whole server system. The conventional back panel is vertical and has vents, however, the heat dissipation environment thereof is harsh, and the server does not have enough space for heat dissipation. Therefore, the design of air channel on the server becomes particularly critical. The server of the invention achieves a very high space utilization and an innovative heat dissipation channels. The package substrate 103 (interposer), the upper HDD back panel 104 (Up HDD BP) and the lower HDD back panel 105 (Down HDD BP) are stacked to form a three-layer structure so as to create heat dissipation channels while making the most use of the space. Meanwhile, the PDB and the FCB are connected via a BTB manner so as to avoid the mess of tangled cables, and five fans, each having two rotors, and a unique air shield are used, such that the heat is effectively dissipated.

The simple and economical design of the cable arms (i.e. the upper and lower cable arms 111) permits the cable arms to be drawn out by the maximum length of 530 mm so that the system appears organized and practical, largely shortening the SAS (Serial Attached SCSI) cables to be less than 1.45 m and thus ensuring the quality of signal.

The server of the invention has high configuration flexibility and expansibility, server motherboard, such as XEON-D and Dual Socket E5, may be disposed in such server, the fan control board 121 and the PDB are connected via a board-to-board manner, and the FCB supplies electricity to the motherboard 122 so as to allow the FCB/PDB to cooperate with the motherboard 122 of different configurations, thereby obtaining the most compatibility thereof and reducing the development cost and thus achieving high flexibility. Alternatively, the storage function can be further expanded by using two HBAs, which are exposed to outside, and connecting four reserved I2C interfaces, which are in the form of RJ45, to four disk assemblies (JBOD). Just a Bunch Of Disks (JBOD or disk assembly) is a storage device that is installed on a bottom panel and includes a plurality of disks, and is known as a Span. Comparing to the RAID array, JBOD has no front-end logics to manage the data distribution on disk, on the contrary, each disk is independently addressed and taken as separated storage resources, taken as a part of host software, or taken as an adapter card of the RAID assembly.

Figure 6A:
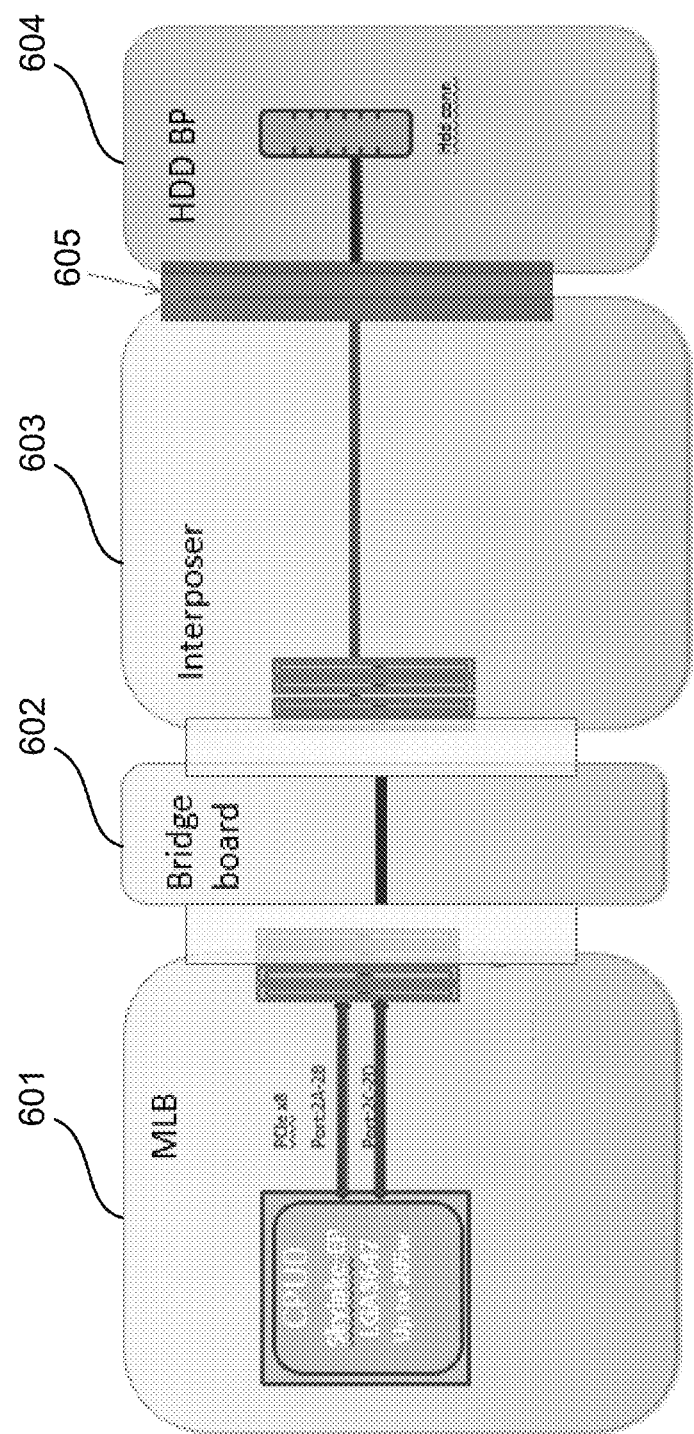
FIG. 6A and FIG. 6B are schematic diagrams showing a communicative configuration of a U.2 NVME of the server according to one embodiment of the invention.
Figure 6B:
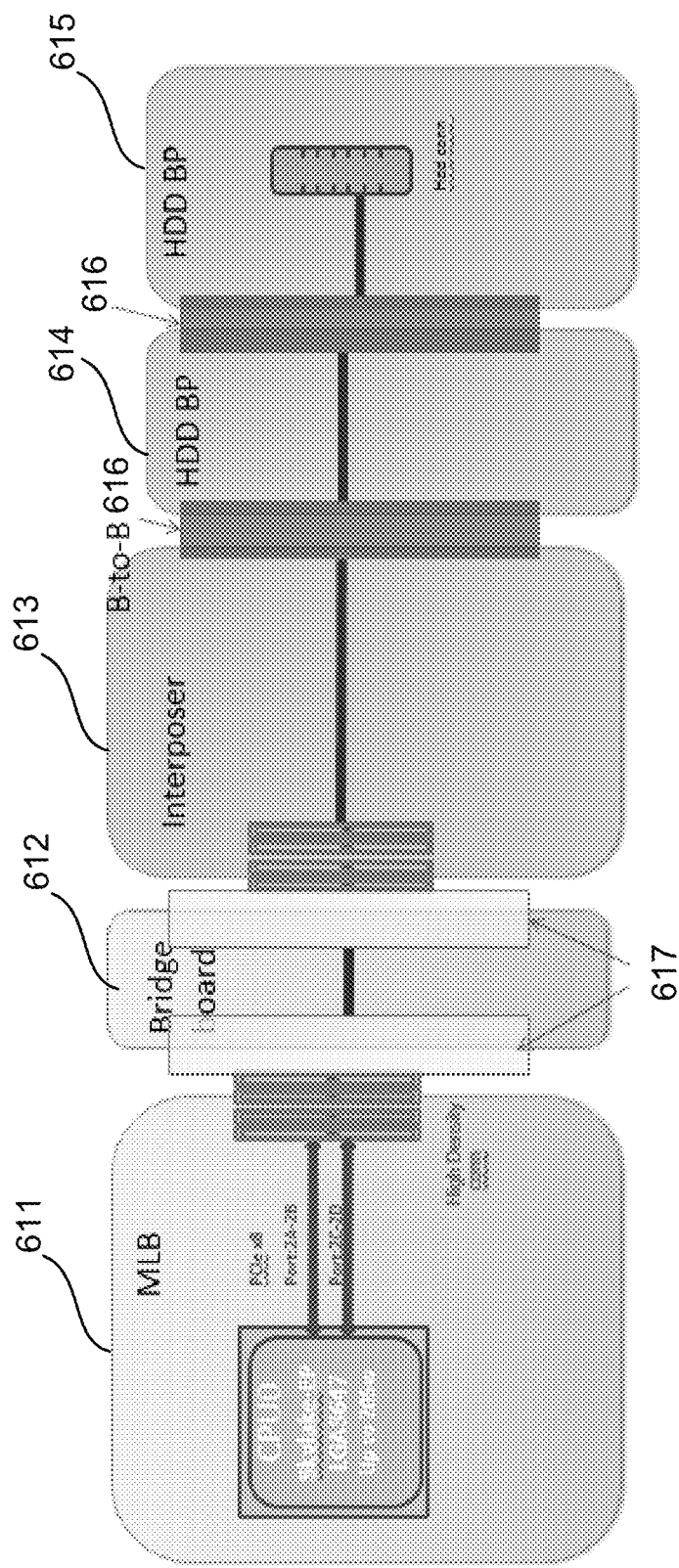
Figure 6C:
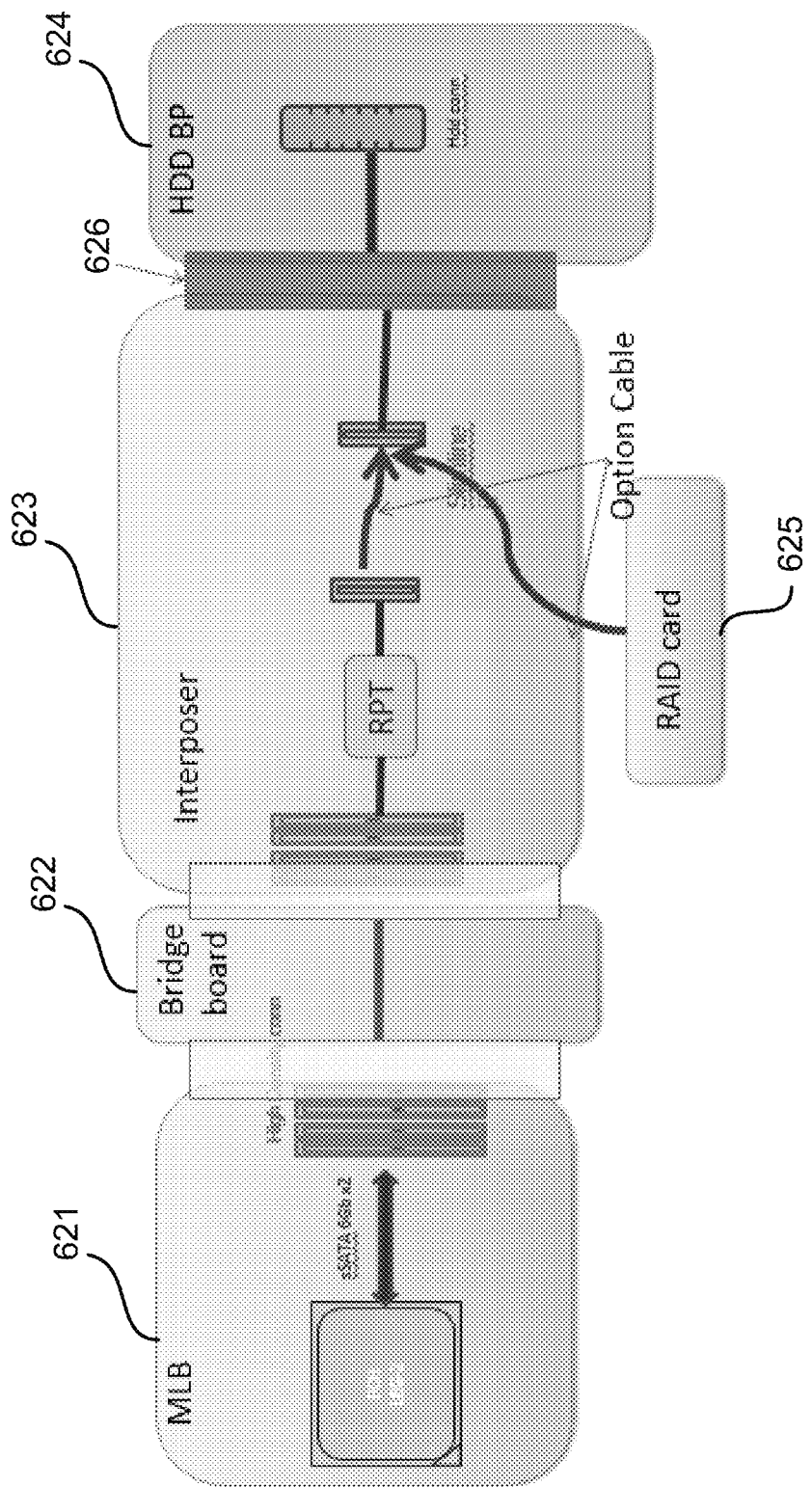
FIG. 6C and FIG. 6D are schematic diagrams showing a communicative configuration of a U.2 SATA HDD of the server according to one embodiment of the invention.
Figure 6D:
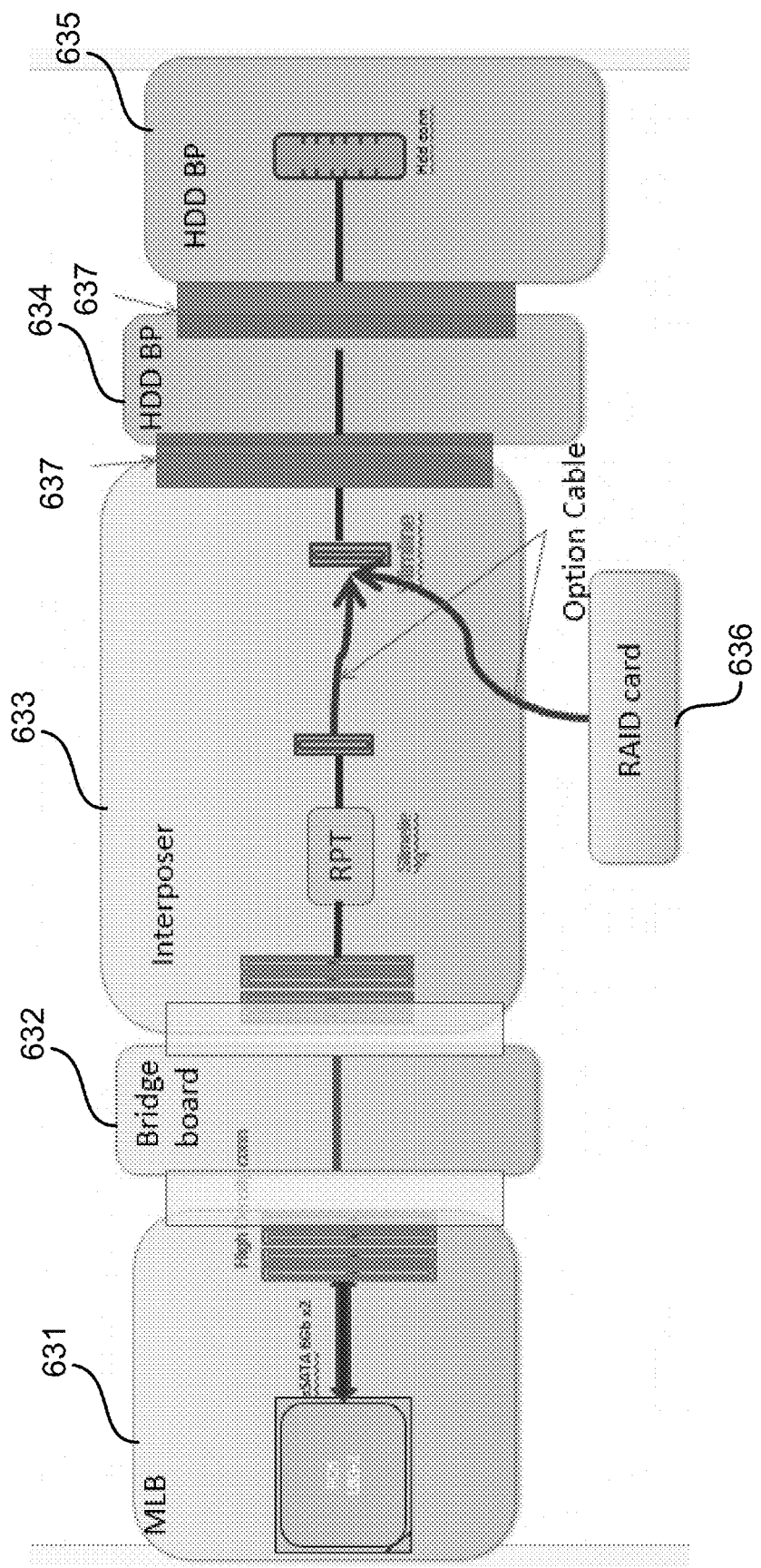

In one embodiment of the invention, please refer to FIG. 6A to FIG. 6E, the configuration of the back panel area 102 of the server is very innovative. The back panel includes four U.2 or four SATA 2.5 HDDs and two M.2, and twenty-four 3.5 HDDs are connected via HBA card. Four U.2 and two M.2 are located on the back panel area 102, and their configurations are very flexible. U.2 may be configured as Non-Volatile Memory express (NVME), as shown in FIG. 6C and FIG. 6D, it may also be configured as SATA tray (software configuration realization).

FIG. 6A is a schematic view of lower HDD back panel (Down HDD BP NVME) in a configuration of U.2 NVME. There are a motherboard 601, a bridge board 602, a package substrate (interposer) 603 and a HDD back panel (HDD BP) 604; the motherboard 601 is communicatively connected to the package substrate (interposer) 603 via the bridge board 602; the package substrate (interposer) 603 and the HDD back panel (HDD BP) 604 are connected via a board-to-board manner 605.

FIG. 6B is a schematic view of upper HDD back panel (Up HDD BP NVME) in a configuration of U.2 NVME. There are a motherboard (MLB) 611, a bridge board 612, a package substrate (interposer) 613, a first HDD back panel (HDD BP) 614 and a second HDD back panel (HDD BP) 615; the motherboard 611 (MLB) is communicatively connected to the package substrate (interposer) 613 via the bridge board 612; the bridge board 612 is communicatively connected to the motherboard 611 (MLB) and the package substrate (interposer) 613 via an exchange panel (GF) 617; the package substrate (interposer) 613 and the first HDD back panel (HDD BP) 614 are connected via a board-to-board manner 616; the second HDD back panel (HDD BP) 615 and the first HDD back panel (HDD BP) 614 are connected via a board-to-board manner 616.

FIG. 6C is a schematic diagram showing a lower HDD back panel (Down HDD BP SATA) in a configuration of U.2 SATA HDD. There are a motherboard (MLB) 621, a bridge board 622, a package substrate (interposer) 623, a HDD back panel (HDD BP) 624 and a redundant arrays of independent drives (RAID) 625; the motherboard 621 (MLB) is communicative connected to the package substrate (interposer) 623 via the bridge board 622; the package substrate (interposer) 623 and the HDD back panel (HDD BP) 624 are connected via a board-to-board manner 626. When the SATA tray is used, the cable may be used to connect the RAID 625 card to the SATA tray or directly connect a platform controller hub (PCH) to the SATA tray. For the purpose of stability and security of the system and data, the RAID card is more reliable, but directly connecting the PCH to the SATA tray permits omitting of one RAID and thus will be more cost-effective.

FIG. 6D is a schematic diagram of an upper HDD back panel (Up HDD BP SATA) in a configuration of U.2 SATA HDD. There are a motherboard (MLB) 631, a bridge board 632, a package substrate (interposer) 633, a third HDD back panel (HDD BP) 634, a fourth HDD back panel (HDD BP) 635 and a RAID 636; the motherboard (MLB) 631 is communicatively connected to the package substrate (interposer) 633 via the bridge board 632; the package substrate (interposer) 633, the third HDD back panel (HDD BP) 634 are connected via a board-to-board manner 637, and the third HDD back panel (HDD BP) 634 and the fourth HDD back panel (HDD BP) 635 are connected via a board-to-board manner 637. When the SATA tray is used, the cable may be used to connect the RAID 625 card to the SATA tray or directly connect a platform controller hub (PCH) to the SATA tray. For the purpose of stability and security of the system and data, the RAID card is more reliable, but directly connecting the PCH to the SATA tray permits omitting of one RAID and thus will be more cost-effective.

Figure 6E:
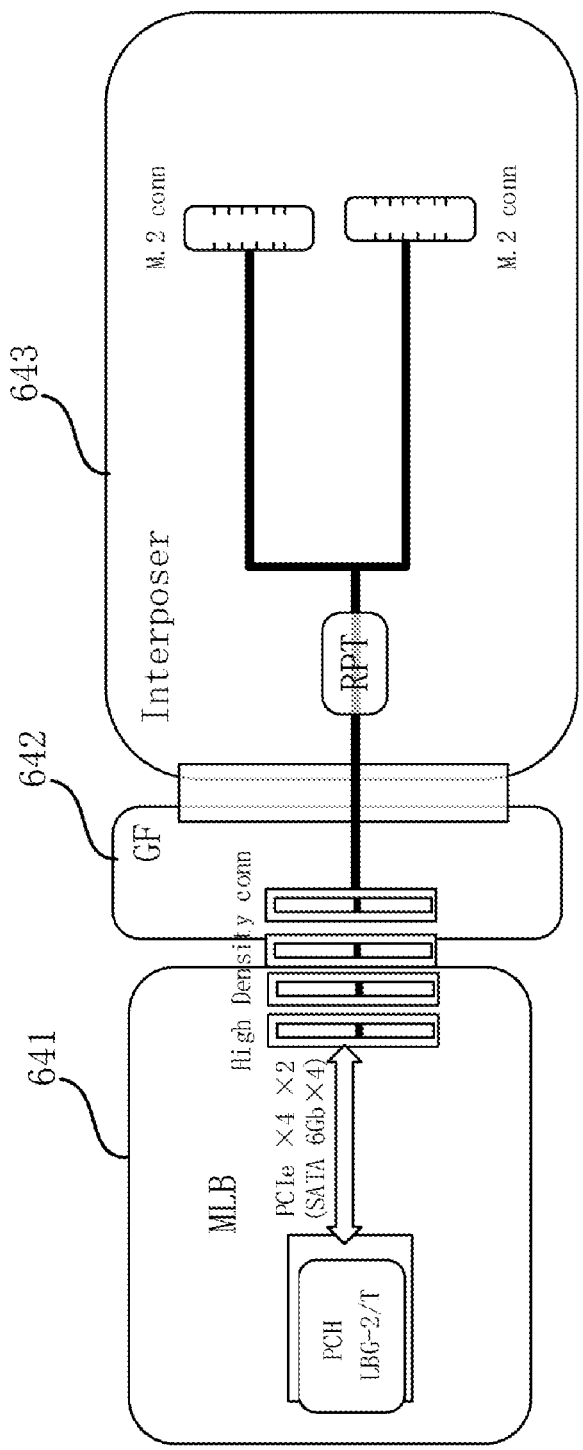
FIG. 6E is a schematic diagram showing a communicative configuration of a M.2 of the server according to one embodiment of the invention.

FIG. 6E is a schematic diagram of a HDD BP in a configuration of M.2. There are a motherboard 641 (MLB), an exchange panel (GF) 642 and a package substrate (interposer) 643. The motherboard (MLB) 641 is communicatively connected to the package substrate (interposer) 643 via the exchange panel (GF) 642. M.2 is directly connected via a HBA and can become a PCIe M.2 or Sata M.2 through software. Four U.2 supports hot insertion/removal and no-screw installation.

Figure 7:
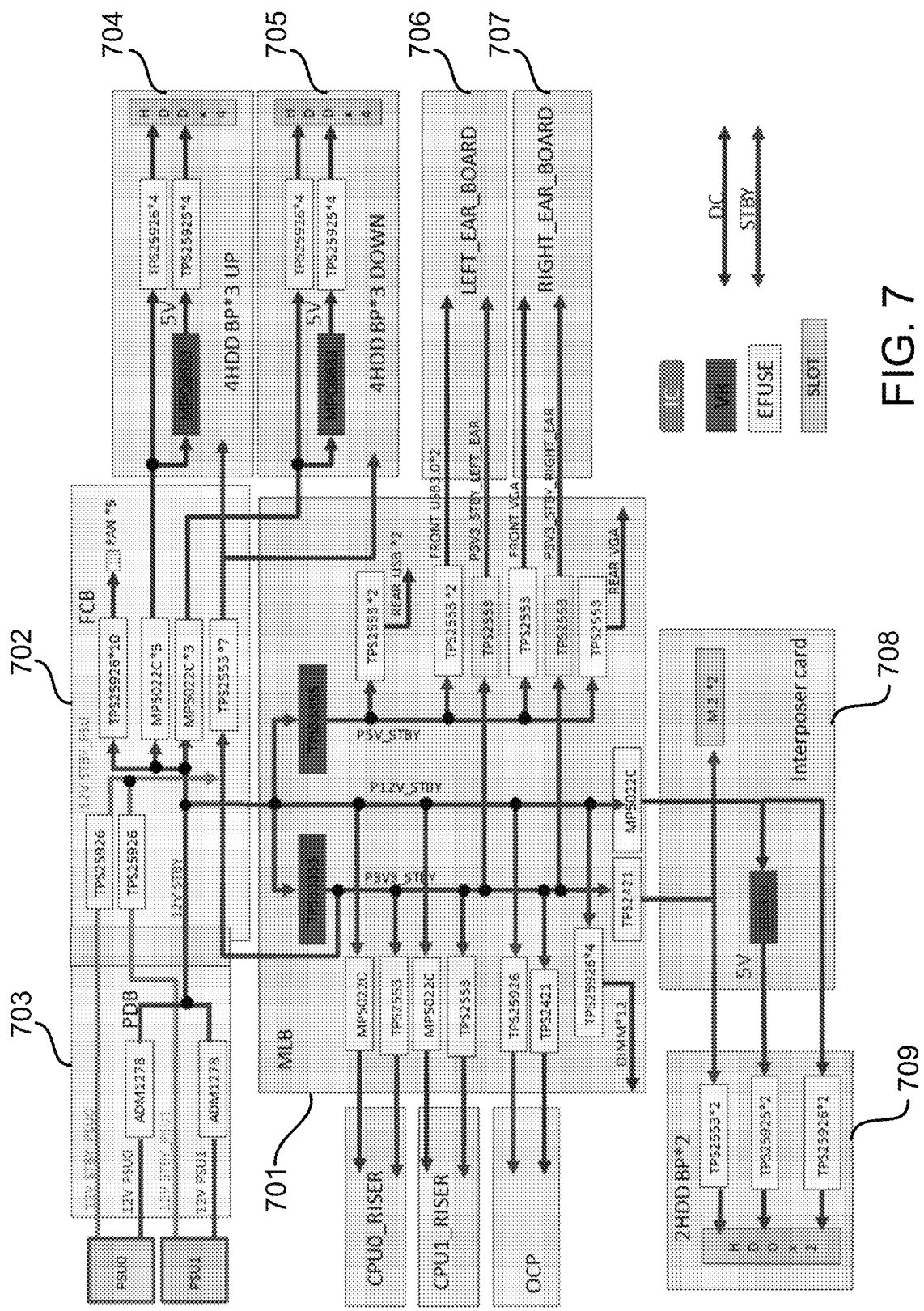
FIG. 7 is a schematic diagram showing an electricity distribution configuration of the server according to one embodiment of the invention.

In one embodiment of the invention, please refer to FIG. 7, which is a schematic diagram showing an electricity distribution configuration of the server according to the embodiment. There are a motherboard 701, a fan control board (FCB) 702, a power daughter board (PDB) 703, an upper HDD back panel (HDD BP UP) 704, a lower HDD back panel (HDD BP Down) 705, a left-ear board 706, a right-ear board 707, a package substrate (interposer) 708 and a HDD back panel (HDD BP) 709. A unique electricity distribution and a powerful prevention design for short circuit are created to prevent any power supply and component in system from short circuit and to allow the system to support various apparatus, such as smart internet card, that are power-consuming and operate in standby mode. Specifically, in the invention, instead of using P12V_STBY_PSU output by the PSU as the electricity while the system is in standby mode, the 220V AC cable is used to enable the P12V to be output once it is inserted. And all of the modules and components that require electricity are protected by eFuse (different from the SRAM array used in most of the FPGA, the eFuse only programs one fuse at a time). This entirely prevents the system from short circuit, and the power supply device that requires direct current (DC) can be enabled through the eFuse after power on. In the case of the apparatus such as smart internet card that is power-consuming and requires to operate in standby mode, the EFUSE may be enabled before power on so that the electricity can be supplied during standby mode, and the fan can operate under the standby mode as well, thereby making the system support those are power-consuming and require to operate in standby mode.

The invention is not limited to the size of the server, 2U, 3U, 4U can be applied to the invention. "U" is an abbreviation of unit and denotes an external size of a server, and its detailed size is defined by the U.S. Energy Information Administration (ETA).

The server of the invention has high dense storage devices, very high space utilization, and innovative heat dissipation channels design, supports toolless assemble and operates in a simple and convenient manner. The storage device for system and critical data can be disposed in a flexible manner. The server is compatible with various types of server mainboards, has high configuration flexibility and expansibility, and can support apparatus that are power-consuming and operating in standby mode.

According to the descriptions discussed above, the invention overcomes various disadvantages in prior art and has high industrial value.

The above embodiments are only use for explaining the principle and function of the invention and are not used to limit the invention. People skilled in the art can modify or alter the above embodiments without departing from the spirit and scope of the invention. Thus, such modification and variation still are within the scope of the invention.

What is claimed is:
1. A server, comprising:
    a casing, having a back panel area, wherein the back panel area is located on an air outlet of the server;
    a package substrate, an upper HDD back panel and a lower HDD back panel horizontally disposed on the back panel area;
    wherein a motherboard of the server is communicatively connected to the package substrate via a first connector, the package substrate is communicatively connected to the upper HDD back panel via a second connector, and the upper HDD back panel is communicatively connected to the lower HDD back panel via a third connector.
2. The server according to claim 1, wherein the first connector comprises a bridge board, and the motherboard of the server is communicatively connected to the package substrate via the bridge board.

3. The server according to claim 1, wherein the second connector and the third connector are board-to-board connectors.

4. The server according to claim 1, wherein the casing further has a front panel area for the installation of a hard disk drive, an upper and lower slidable trays and an upper and lower inner slide rails are disposed on the front panel area of the casing, and the upper and lower slidable trays are respectively slidably disposed on the upper and lower inner slide rails.

5. The server according to claim 4, wherein an upper and lower cable arms are disposed on the front panel area of the casing, the upper and lower cable arms are foldable; when the upper and lower slidable trays are drawn out of the casing through the upper and lower slide rails, the upper and lower cable arms respectively experience force and thus being unfolded, when the upper and lower slidable trays slide into the casing through the upper and lower slide rails, the upper and lower cable arms respectively experience force and thus being folded.

6. The server according to claim 1, wherein a fan frame is disposed on the back panel area of the casing and is configured for the installation of a plurality of fan assemblies, and an engagement structure is disposed on the fan frame and configured to conveniently install the fan frame in the casing.

7. The server according to claim 6, wherein each of the fan assemblies has a handle configured for the manual installation of the plurality of fan assemblies into the fan frame or for the manual removal of the plurality of fan assemblies from the fan frame.

8. The server according to claim 1, wherein a fan control board and a PDB of the server are connected by a board-to-board manner and are configured to supply electricity to the server.

9. The server according to claim 1, wherein the fan control board of the server is in a L shape for matching different types of the motherboard.

10. The server according to claim 1, wherein the motherboard is connected to a disk assembly via a host bus adapter and/or an I2C interface.

* * * * *